(12) United States Patent
Spevak

(10) Patent No.: US 11,929,744 B2
(45) Date of Patent: Mar. 12, 2024

(54) DIFFERENTIAL CAPACITIVE SENSING SYSTEM

(71) Applicant: TEXAS INSTRUMENTS INCORPORATED, Dallas, TX (US)

(72) Inventor: Peter Spevak, Moosburg an der Isar (DE)

(73) Assignee: Texas Instruments Incorporated, Dallas, TX (US)

( * ) Notice: Subject to any disclaimer, the term of this patent is extended or adjusted under 35 U.S.C. 154(b) by 510 days.

(21) Appl. No.: 16/783,291

(22) Filed: Feb. 6, 2020

(65) Prior Publication Data

US 2020/0259493 A1   Aug. 13, 2020

Related U.S. Application Data

(60) Provisional application No. 62/950,715, filed on Dec. 19, 2019, provisional application No. 62/803,920, filed on Feb. 11, 2019.

(51) Int. Cl.
*G01L 1/14* (2006.01)
*G01D 5/241* (2006.01)
(Continued)

(52) U.S. Cl.
CPC .......... *H03K 17/975* (2013.01); *G01D 5/241* (2013.01); *G01L 1/144* (2013.01); *G01R 27/2605* (2013.01)

(58) Field of Classification Search
CPC ...... H03K 17/975; H03K 17/965; G01D 5/24; G01D 5/2403; G01D 5/241; G01D 5/2412;
(Continued)

(56) References Cited

U.S. PATENT DOCUMENTS 4,489,609 A   12/1984   Burdess et al.
2002/0059829 A1   5/2002   Sakai
(Continued)

FOREIGN PATENT DOCUMENTS

CN   106872730 A  *  6/2017  ............ G01P 15/125
CN   106872730 A     6/2017
(Continued)

OTHER PUBLICATIONS

PCT International Search Report; PCT/US 2020/017225; dated May 14, 2020.
(Continued)

*Primary Examiner* — Tarun Sinha
*Assistant Examiner* — James I Burris
(74) *Attorney, Agent, or Firm* — Michael T. Gabrik; Frank D. Cimino

(57) ABSTRACT

An apparatus includes a moveable electrode which moves along an interstitial pathway defined by four fixed electrodes. The first and second fixed electrodes are separated by a first distance. The third and fourth fixed electrodes are separated by a second distance and adjacent to the first and second fixed electrodes, respectively. A capacitance sensing circuit coupled to the four fixed electrodes determines a first capacitance using the first and second fixed electrodes and a second capacitance using the third and fourth fixed electrodes. In some examples, the apparatus also comprises fifth and sixth fixed electrodes separated by a third distance and orthogonal to the first and second fixed electrodes and seventh and eighth fixed electrodes separated by a fourth distance and orthogonal to the third and fourth fixed electrodes. The fifth and seventh fixed electrodes are adjacent, and the sixth and eighth fixed electrodes are adjacent.

25 Claims, 14 Drawing Sheets

(51) Int. Cl.
*G01R 27/26* (2006.01)
*H03K 17/975* (2006.01)

(58) Field of Classification Search
CPC .. G01D 5/2415; G01D 5/2417; G01D 5/2405; G01L 1/142; G01L 1/144; G01L 1/146; G01L 1/148; G01R 27/2605; G01R 27/2647; G01R 27/2623
See application file for complete search history.

(56) References Cited

U.S. PATENT DOCUMENTS

| | | | | |
|---|---|---|---|---|
| 2004/0182158 A1* | 9/2004 | Tsubaki | ............. | G01P 15/0802 324/661 |
| 2009/0076460 A1* | 3/2009 | Nielsen | ............. | A61M 5/31525 324/207.17 |
| 2019/0233279 A1* | 8/2019 | Yanagisawa | .......... | H01L 23/055 |

FOREIGN PATENT DOCUMENTS

| | | | | |
|---|---|---|---|---|
| CN | 105182005 B | 2/2018 | | |
| CN | 207908539 U | 9/2018 | | |
| DE | 112013004893 T5 * | 6/2015 | .............. | G01B 7/00 |
| EP | 780748 B1 | 11/2002 | | |
| EP | 2108964 A2 * | 10/2009 | ......... | G01C 19/5719 |
| EP | 2108964 A2 | 10/2009 | | |

OTHER PUBLICATIONS

Notification of First Office Action dated Feb. 13, 2023, Chinese Application No. 202080013483.2, 21 pages.

\* cited by examiner

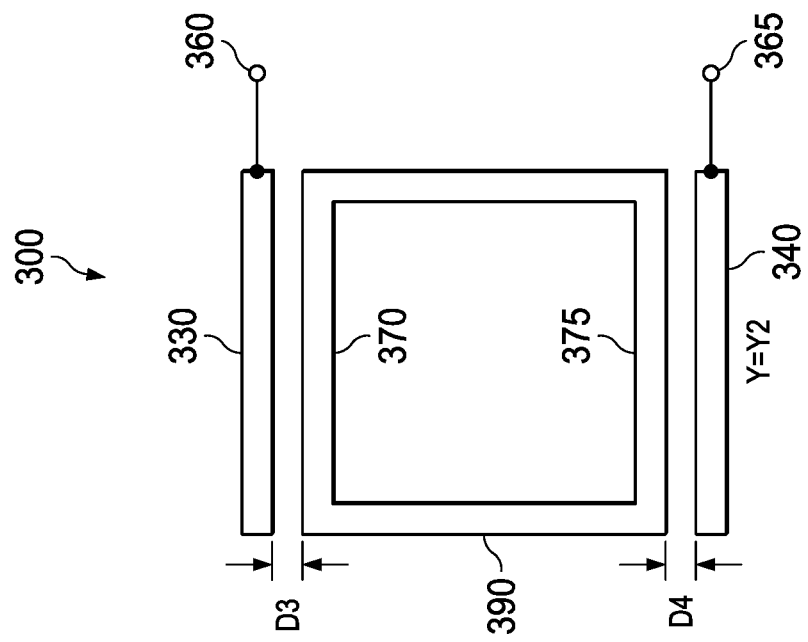
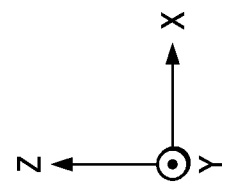
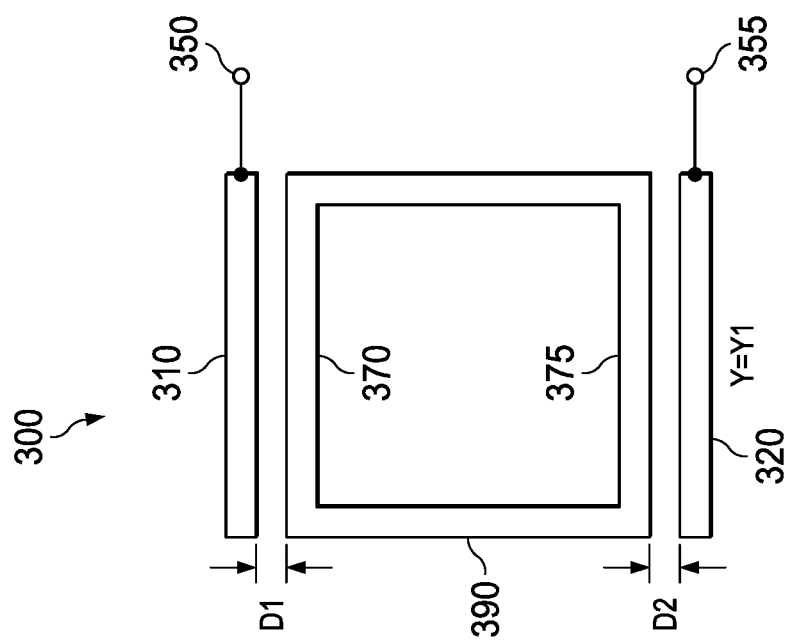
FIG. 3C

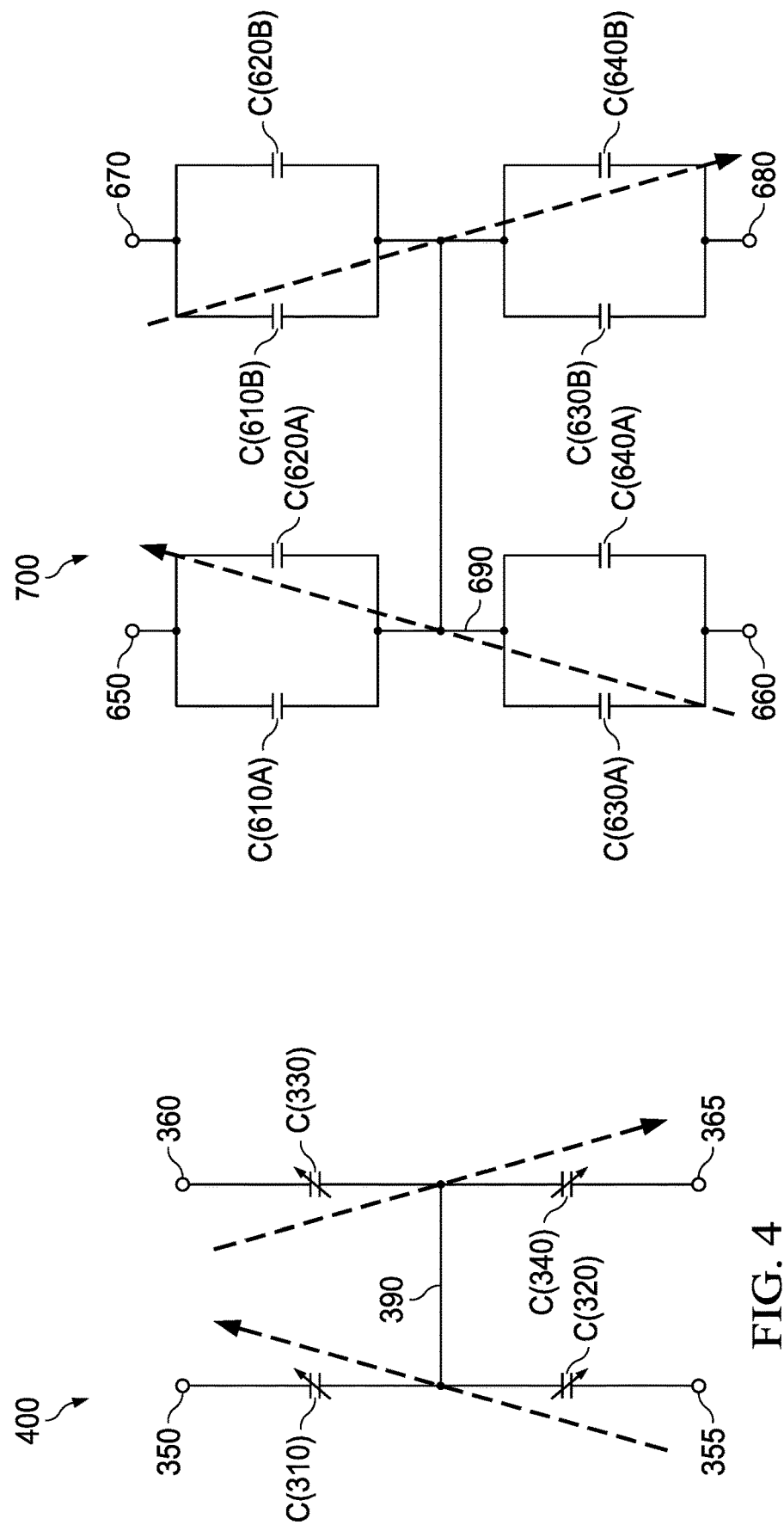

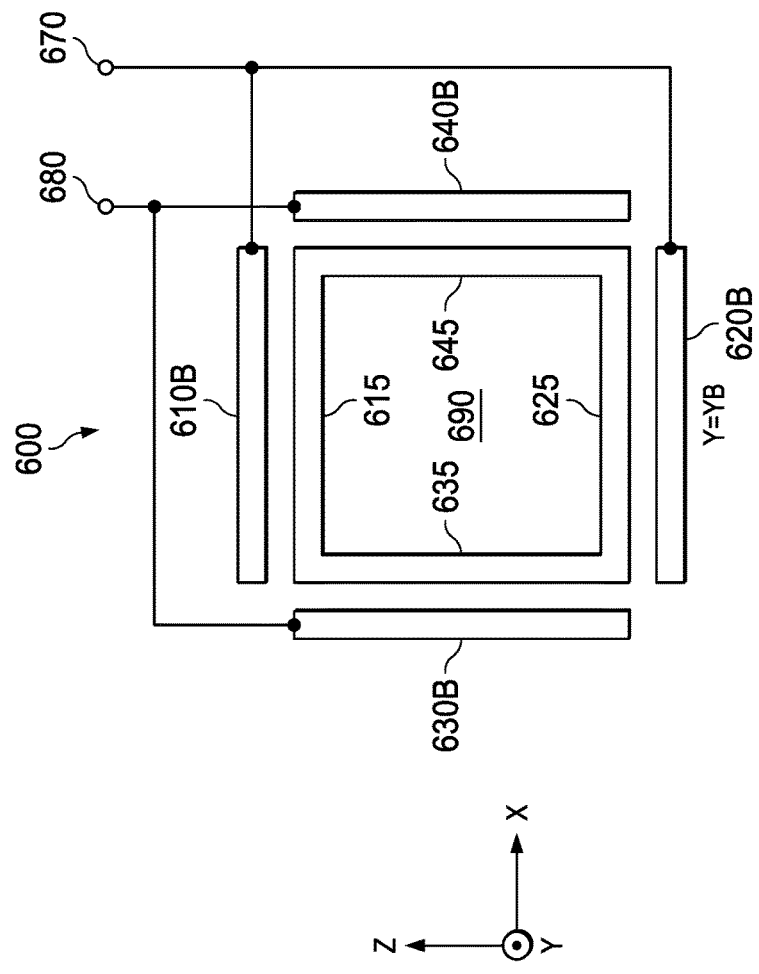
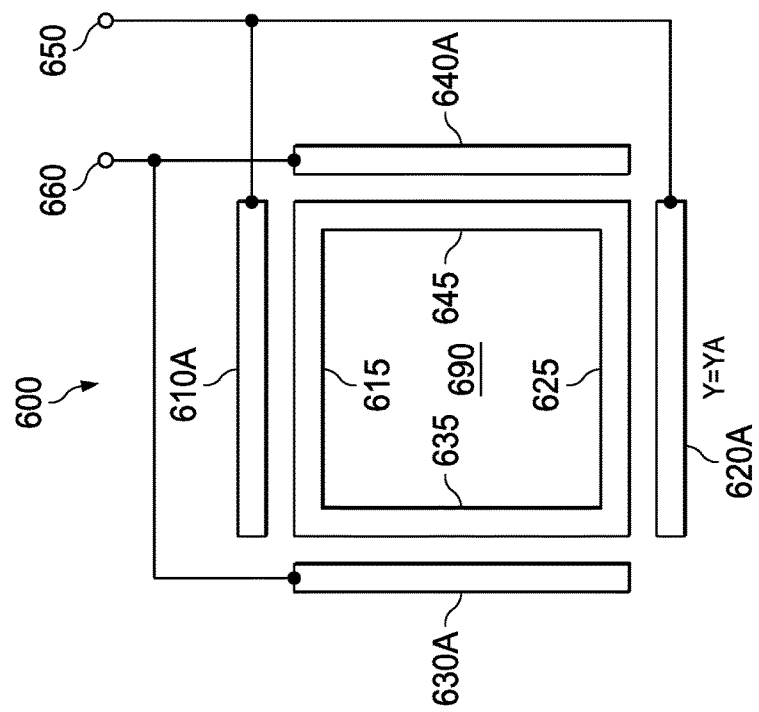
FIG. 6C

DIFFERENTIAL CAPACITIVE SENSING SYSTEM

CROSS-REFERENCE TO RELATED APPLICATIONS

This application claims priority to U.S. Provisional Application No. 62/803,920, filed Feb. 11, 2019, and U.S. Provisional Application No. 62/950,715, filed Dec. 19, 2019, which are hereby incorporated by reference.

U.S. Non-Provisional Application Ser. No. 16/532,652 titled "Compensation of Mechanical Tolerance in a Capacitive Sensing Control Element" and filed Aug. 6, 2019 may contain related subject matter and is hereby incorporated by reference.

BACKGROUND

Many types of machines and devices are operated by a user pulling or pressing a mechanical actuator (e.g., a trigger, a button, etc.). For some equipment, the force with which the user operates the actuator effects the operation of the device. For example, the harder the user pulls the trigger of a drill, the faster the drill's motor is made to spin, increasing the speed of the drill bit. Some devices use capacitive sensing to implement this kind of force-sensitive control mechanism. Many capacitive sensing systems do not directly measure capacitance and instead indirectly determine capacitance based on measured changes in the charge on electrodes.

However, the electric field and relative charge of electrodes can be influenced by interfering electric fields, stress on the electrodes, touch or other disturbances, temperature, humidity, and the like, and some capacitive sensing systems may not distinguish between environmental and capacitive changes to the charge on the electrodes. In the example of a drill, interfering electric fields, temperature, humidity, and the like may change the capacitance of the actuator such that the drill bit is slower or faster than the user anticipates, impeding the user's ability to perform tasks with the drill and increasing the risk of injury.

SUMMARY

An example apparatus includes four fixed electrodes which define an interstitial pathway and a moveable electrode configured to move along the interstitial pathway. The first and second fixed electrodes are separated by a first distance, and the third and fourth fixed electrodes are separated by a second distance. The first and third fixed electrodes are adjacent, and the second and fourth fixed electrodes are adjacent. A capacitance sensing circuit coupled to the four fixed electrodes determines a first capacitance using the first and second fixed electrodes and a second capacitance using the third and fourth fixed electrodes. In some implementations, the first and second fixed electrodes are coupled together at a first node, and the third and fourth fixed electrodes are coupled together at a second node. In some examples, the moveable electrode comprises a floating electrode. In some examples, the moveable electrode is not electrically connected to the capacitance sensing circuit.

Some implementations also include fifth and sixth fixed electrodes separated by a seventh distance and orthogonal to the first and second fixed electrodes. Seventh and eighth fixed electrodes are separated by an eighth distance and are orthogonal to the third and fourth fixed electrodes. The fifth and seventh fixed electrodes are adjacent, and the sixth and eighth fixed electrodes are adjacent. In some implementations, the fifth and sixth fixed electrodes are coupled together at a third node, and the seventh and eighth fixed electrodes are coupled together at a fourth node.

BRIEF DESCRIPTION OF THE DRAWINGS

For a detailed description of various examples, reference will now be made to the accompanying drawings in which:

FIGS. 3A-C illustrate an example configuration of a moveable electrode and two pairs of adjacent fixed electrodes.

FIG. 4 shows an electrical model of the electrodes of FIGS. 3A-C.

FIGS. 6A-C illustrate an example configuration of a moveable electrode and four pairs of fixed electrodes.

FIG. 7 shows an electrical model of the electrodes of FIGS. 6A-C.

DETAILED DESCRIPTION

The disclosed differential capacitive sensing systems are directed to a capacitance-based sensing technique to determine a position of a moveable electrode, such as a moveable electrode included in an actuator for controlling operation of a device. The disclosed differential capacitive sensing systems include multiple electrically conductive electrodes configured as two or more capacitors. Some of the electrodes are fixed in place within the device and form an interstitial pathway, and the moveable electrode moves relative to the fixed electrodes along the interstitial pathway as the user applies force to the actuator. Movement of the moveable electrode along the pathway causes inverse changes in capacitance for the fixed electrodes, such that the position of the moveable electrode may be determined from differential, rather than absolute, capacitive measurements. Since all the fixed electrodes are influenced by temperature, humidity, and the like in substantially the same way, any changes in capacitance from environmental conditions are ignored in the differential capacitive measurements.

Figure 1:
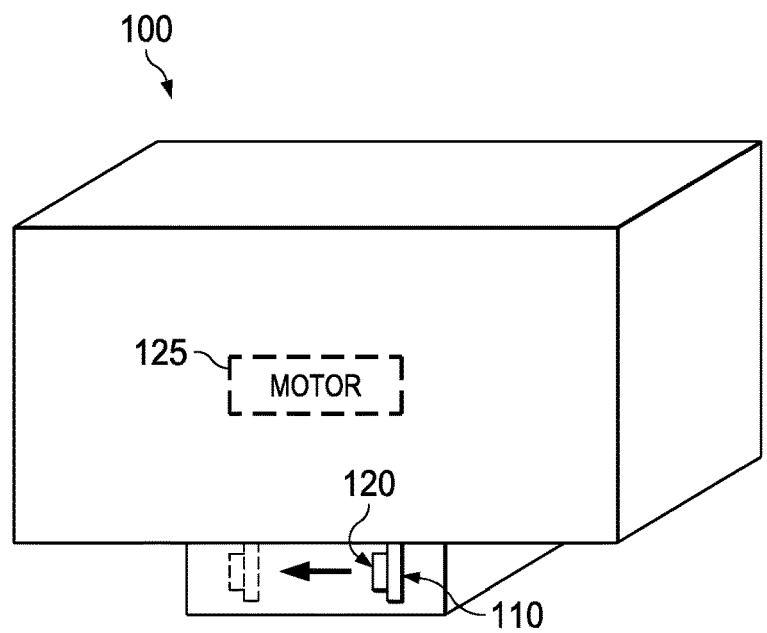
FIG. 1 illustrates a device that includes a capacitive sensing control actuator.

FIG. 1 illustrates a device 100 having an actuator 110. The actuator 110 is moved through application of force. For example, a person may push or pull the actuator 110, which may resist motion due to a spring or other force-resistive mechanism. A moveable electrode 120 is coupled to the actuator 110. Thus, as the actuator 110 moves, the moveable electrode 120 also moves. The moveable electrode 120 moves relative to fixed electrodes, not shown in FIG. 1 but shown in detail in FIGS. 3A-C, 6A-C, and 9A-F. Movement of the actuator 110 causes the device 100 to perform a function (e.g., drilling). The device 100 in this example includes a motor 125 whose speed is controlled through application of force (e.g., by a person's finger)—e.g., the motor's speed is proportional to the amount of force applied to the actuator 110. The moveable electrode 120 forms part of two or more capacitors, whose capacitances change as the moving electrode moves. The changes in capacitance are detected by a capacitive sensing circuit (discussed below), and the changes in capacitance cause the function performed by the device 100 to change (e.g., start, stop, increase speed of a motor, decrease speed of the motor, etc.).

Figure 2:
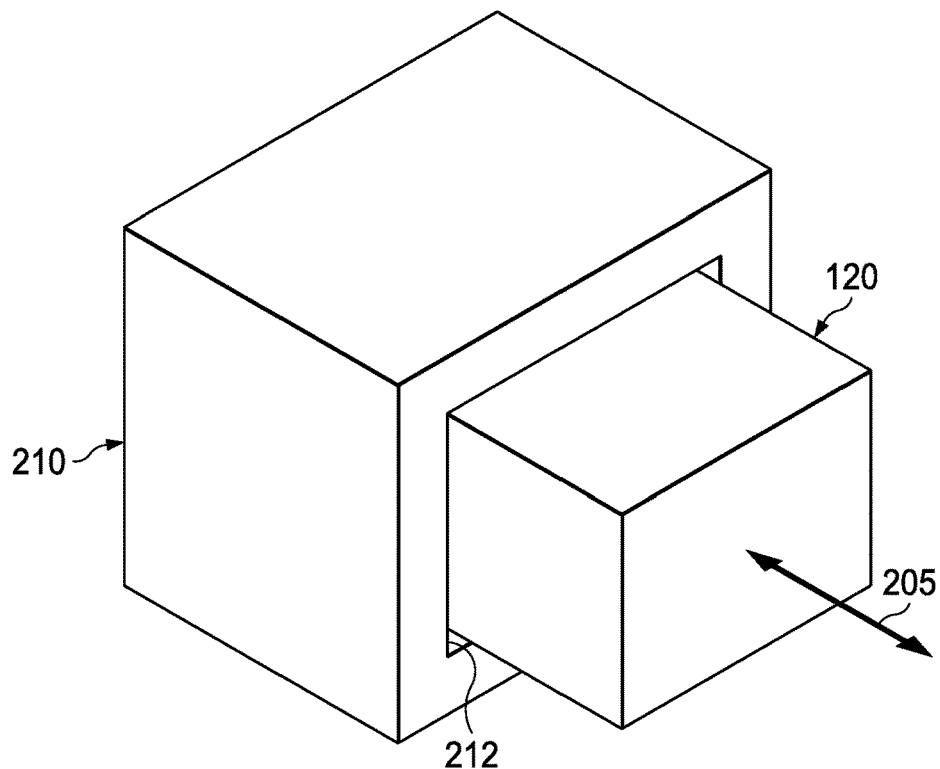
FIG. 2 illustrates that the capacitance sensing control actuator shown in FIG. 1 comprises a moveable electrode that moves relative to a fixed electrode.

FIG. 2 shows one example of electrodes usable in a capacitive-based sensing technique. Moveable electrode 120 moves along the path indicated by arrow 205 relative to fixed electrode 210. The electrodes 120 and 210 are made of, or otherwise coated with an electrically conductive material (e.g., metal). Fixed electrode 210 does not move relative to the device (e.g., device 100) in which it is used. In this example, fixed electrode 210 has a cross-sectional shape that is approximately rectangular (e.g., rectangle or rectangle with rounded corners). In some examples, the rectangular cross-sectional shape is approximately square. The fixed electrode 210 has an internal cavity 212, and the moveable electrode 120 is disposed within the internal cavity 212. The cross-sectional shape of the moveable electrode 120 in this example also is approximately rectangular. Other cross-sectional shapes for the moveable and fixed electrodes 120 and 210 are possible as well (e.g., oval, circular, etc.).

Figure 3A:
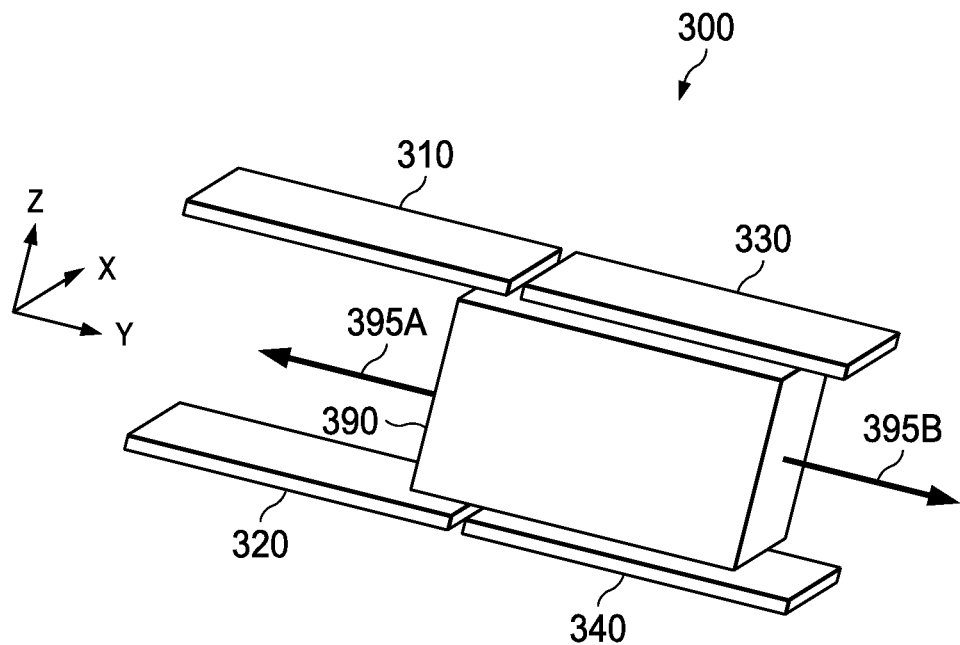
Figure 3B:
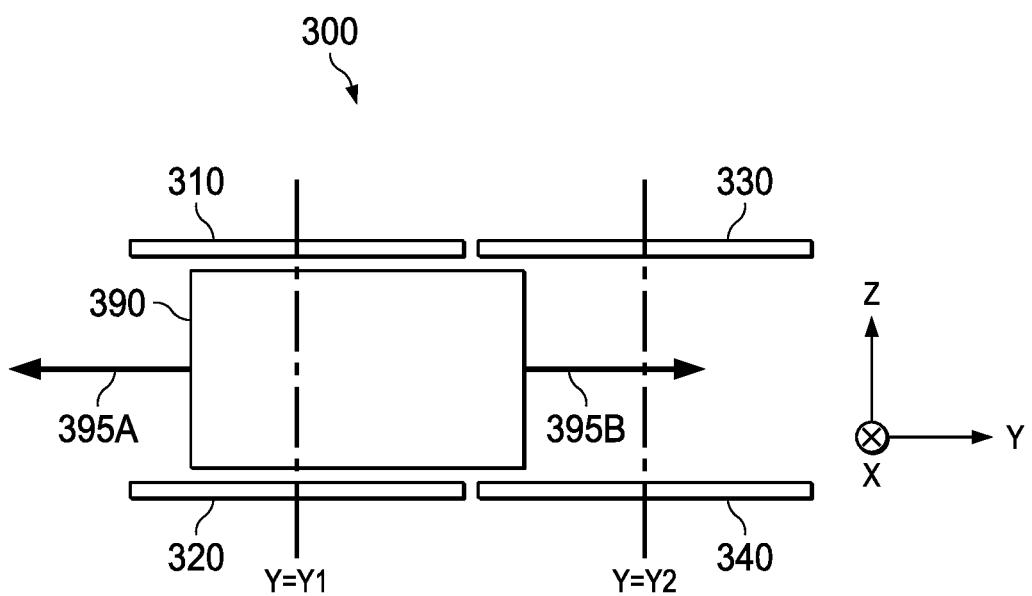

FIGS. 3A-C illustrate an example configuration 300 of a moveable electrode 390 and two pairs of adjacent fixed electrodes. Configuration 300 includes a first pair of fixed electrodes 310 and 320 and a second pair of fixed electrodes 330 and 340 adjacent to the first pair of fixed electrodes. FIG. 3A illustrates an angled perspective of configuration 300. The first pair of fixed electrodes 310 and 320 and the second pair of fixed electrodes 330 and 340 are each separated by a distance such that the fixed electrodes define an interstitial pathway between the first pair of fixed electrodes 310 and 320 and the second pair of fixed electrodes 330 and 340. Moveable electrode 390 moves along the interstitial pathway, indicated by arrows 395A-B.

FIG. 3B illustrates a side view of configuration 300. In the first pair of fixed electrodes, electrode 310 and electrode 320 are separated by a distance such that moveable electrode 390 can pass between electrode 310 and electrode 320. In the second pair of electrodes, electrode 330 and electrode 340 are separated by a distance such that moveable electrode 390 can pass between electrode 330 and electrode 340. Movement of moveable electrode 390 along pathway 395 relative to fixed electrodes 310-340 changes the amount of surface area overlap between moveable electrode 390 and each pair of fixed electrodes, and, by extension, changes the capacitance between moveable electrode 390 and each pair of fixed electrodes. An increase in surface area between moveable electrode 390 and one particular pair of fixed electrodes corresponds to a decrease in surface area between moveable electrode 390 and the other pair of fixed electrodes, which causes the capacitances of the two pairs of fixed electrodes to change inversely.

As moveable electrode 390 moves along pathway 395 in the direction of 395A, the amount of surface area between moveable electrode 390 and the first pair of fixed electrodes 310 and 320 increases. Conversely, the amount of surface area between moveable electrode 390 and the second pair of fixed electrodes 330 and 340 decreases. As moveable electrode 390 moves along pathway 395 in the direction of 395B, the amount of surface area between moveable electrode 390 and the first pair of fixed electrodes 310 and 320 decreases. Conversely, the amount of surface area between moveable electrode 390 and the second pair of fixed electrodes 330 and 340 increases. That is, movement of moveable electrode 390 changes the capacitance of the first pair of fixed electrodes 310 and 320 inversely to the change in capacitance of the second pair of fixed electrodes 330 and 340.

The inverse changes in capacitance for the first pair of fixed electrodes 310 and 320 and for the second pair of fixed electrodes 330 and 340 negates any changes in capacitance due to interfering electric fields and changes in temperature, humidity, air pressure, supply voltage, device parameters, and the like. The first pair of fixed electrodes 310 and 320 and the second pair of fixed electrodes 330 and 340 experience substantially the same environmental conditions, which influence the capacitance of the first and second pair of fixed electrodes in substantially the same way. Any changes in the capacitance of the first pair of fixed electrodes 310 and 320 relative to the capacitance of the second pair of fixed electrodes 330 and 340 are substantially caused by the movement of moveable electrode 390 along pathway 395, such that the position of moveable electrode 390 may be determined based on the inverse changes in capacitance for the first pair of electrodes 310 and 320 and the second pair of electrodes 330 and 340.

FIG. 3C illustrates cross-sections of configuration 300 at y=y1 and y=y2, indicated in FIG. 3B. The cross-section at y=y1 shows the first pair of fixed electrodes 310 and 320 and moveable electrode 390. Surface 370 of moveable electrode 390 is adjacent to fixed electrode 310 and separated from fixed electrode 310 by a distance d1. Surface 375 of moveable electrode 390 is adjacent to fixed electrode 320 and separated from fixed electrode 320 by a distance d2. Fixed electrode 310 is coupled to node 350, and fixed electrode 320 is coupled to node 355. The cross-section at y=y2 shows the second pair of fixed electrodes 330 and 340 and moveable electrode 390. Surface 370 is adjacent to fixed electrode 330 and separated from fixed electrode 330 by a distance d3. Surface 375 is adjacent to fixed electrode 340 and separated from fixed electrode 340 by a distance d4. Fixed electrode 330 is coupled to node 360, and fixed electrode 340 is coupled to node 365.

In theory, the distances d1-d4 between the surfaces 370 and 375 and fixed electrodes 310-340 do not change. However, due to manufacturing tolerances in the dimensions and shapes of the surfaces of the electrodes, tilting of moveable electrode 390 relative to the fixed electrodes 310-340, and/or vibrations experienced by a device including electrode configuration 300, the distances d1-d4 may indeed vary, changing the capacitances for the first and second pairs of fixed electrodes. As the distances d1 and d3 between surface 370 and fixed electrodes 310 and 330 decrease, the distances d2 and d4 between surface 375 and fixed electrodes 320 and 340 increase. As such, any change in capacitance between surface 370 and fixed electrodes 310 and 330 from a change in d1 and d3 is offset by a corresponding and inverse change in capacitance between surface 375 and fixed electrodes 320 and 340. Similarly, changes in capacitance due to moveable electrode 390 tilting within pathway 395 is offset. For example, moveable electrode 390 tilts such that d1 and d4 decrease and d2 and d3 increase. The corresponding changes in capacitance for fixed electrodes 310-340 from the changes in d1-d4 are offset.

FIG. 4 shows an electrical model 400 of the electrodes in configuration 300 shown in FIGS. 3A-C. Capacitor C(310) represents the capacitance formed by fixed electrode 310 and surface 370, and capacitor C(320) represents the capacitance formed by fixed electrode 320 and surface 375. Capacitor C(330) represents the capacitance formed by fixed electrode 330 and surface 370, and capacitor C(340) represents the capacitance formed by fixed electrode 340 and surface 375. In this example, moveable electrode 390 floats, that is, moveable electrode 390 is not galvanically connected to a capacitance sensing circuit.

The arrows through each capacitor indicate the change in each capacitor relative to the other capacitor of the parallel pair, for example due to tilting of moveable electrode 390 within pathway 395 such that the distances d1-d4 between moveable electrode 390 and each of fixed electrodes 310-340 change. The arrows through each capacitor in a pair of capacitors C(310)/C(320) or C(330)/C(340) are in opposite directions to indicate that a change in the capacitance of one capacitor corresponds to an inverse change in the capacitance of the other capacitor in the pair. For example, as moveable electrode 390 tilts within pathway 395, the distance d1 increases and the capacitance of C(310) decreases. The distance d2 decreases and the capacitance of C(320) increases. The larger, dashed arrows through the pairs of capacitors C(310)/C(320) and C(330)/C(340) indicate the change in each capacitor pair relative to the adjacent capacitor pair, i.e., C(310)/C(320) relative to C(330)/C(340). For example due to movement of moveable electrode 390 along pathway 395, the surface area between moveable electrode 390 and the first fixed pair of electrodes 310 and 320 increases while the surface area between moveable electrode 390 and the second fixed pair of electrodes 330 and 340 decreases, and vice versa. The position and movement of moveable electrode 390 along pathway 395 can be determined from the capacitance measurements for the first and second pairs of fixed electrodes.

Figure 5:
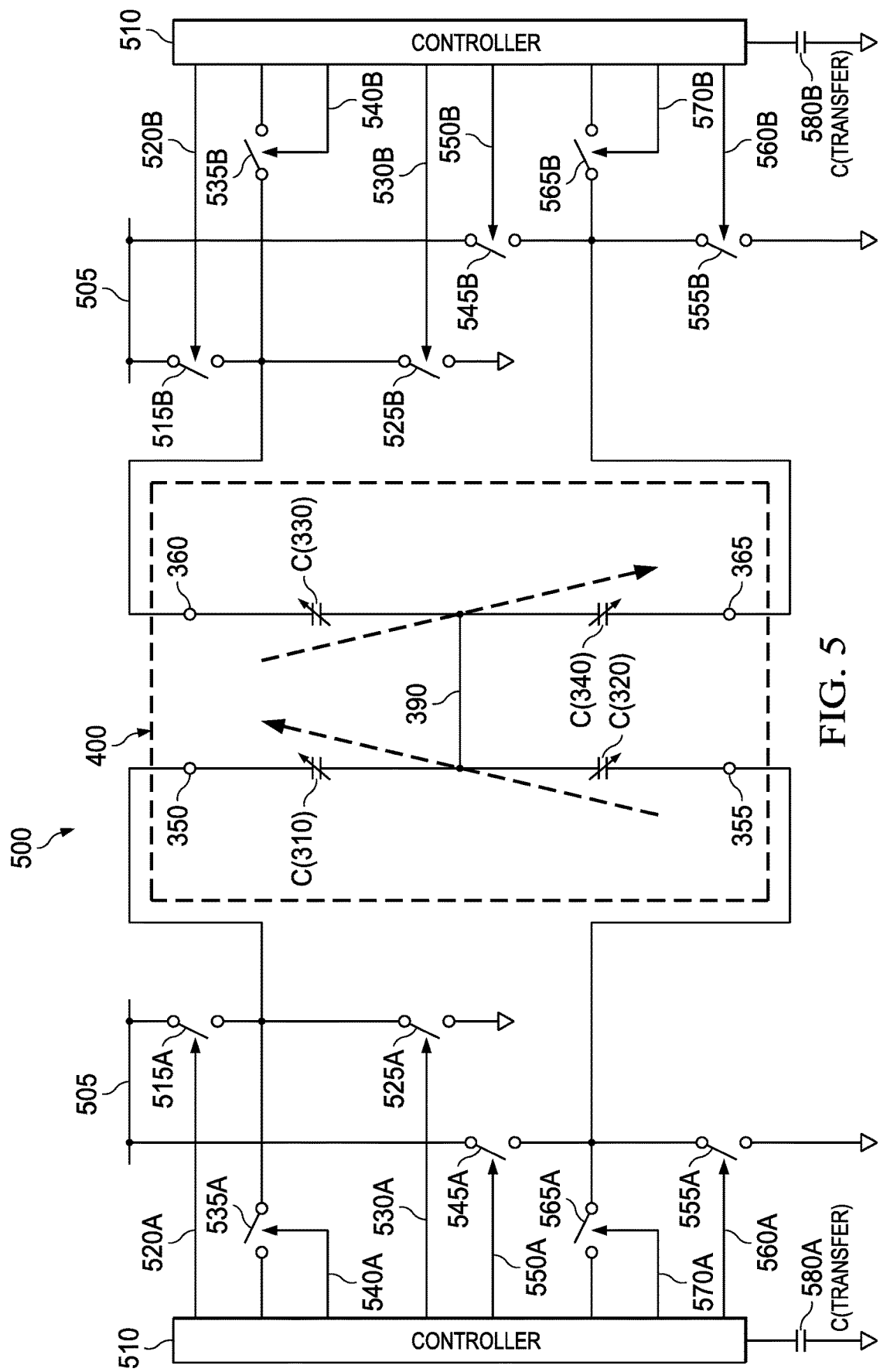
FIG. 5 illustrates an example differential capacitive sensing circuit coupled to the electrodes of FIGS. 3A-C for measuring the effective capacitance of the moveable and fixed electrodes.

FIG. 5 shows an example capacitive sensing circuit 500 coupled to the electrode configuration 300 of FIGS. 3A-C for measuring the effective capacitance of the moveable and fixed electrodes. The electrodes in configuration 300 are represented by electrical model 400 shown in FIG. 4. Capacitive sensing circuit 500 is coupled to nodes 350, 355, 360, and 365 to determine the effective capacitance at each node. In this example, capacitive sensing circuit 500 includes a controller 510, switches 515A-B, 525A-B, 535A-B, 545A-B, 555A-B, and 565A-B, and charge transfer capacitors C(transfer) 580A-B. Capacitive sensing circuit 500 implements a charge transfer technique to determine the effective capacitance of the first pair of capacitors C(310) and C(320) and the second pair of capacitors C(330) and C(340).

In some examples, controller 510 is a finite state machine. Controller 510 controls the open/closed (on/off) state of switches 515A-B using control signals 520A-B respectively, switches 525A-B using control signals 530A-B respectively, switches 535A-B using control signals 540A-B respectively, switches 545A-B using control signals 550A-B respectively, switches 555A-B using control signals 560A-B respectively, and switches 565A-B using control signals 570A-B respectively. Node 350 is connected to switches 515A, 525A, and 535A. Node 355 is connected to switches 545A, 555A, and 565A. Node 360 is connected to switches 515B, 525B, and 535B. Node 365 is connected to switches 545B, 555B, and 565B. Switches 515A-B and 545A-B are further connected to a reference voltage on a reference voltage node 505. Switches 525A-B and 535A-B are further coupled to a ground node.

Controller 510 turns on one of switches 515A or 525A, but not both simultaneously, connecting capacitor C(310) to the reference voltage or to ground. Controller 510 turns on one of switches 545A and 555A, but not both simultaneously, connecting capacitor C(320) to the reference voltage or to ground. While C(310) is connected to the reference voltage, controller 510 connects C(320) to ground, and vice versa. Similarly, controller 510 turns on one of switches 515B or 525B, but not both simultaneously, connecting capacitor C(330) to the reference voltage or to ground. Controller 510 turns on one of switches 545B and 555B, but not both simultaneously, connecting capacitor C(340) to the reference voltage or to ground. While C(330) is connected to the reference voltage, controller 510 connects C(340) to ground, and vice versa.

Controller 510 measures the effective capacitance for the first pair of fixed electrodes at nodes 350 and 355 and the effective capacitance for the second pair of fixed electrodes at 360 and 365 sequentially. To measure the effective capacitance for the first fixed pair of electrodes at nodes 350 and 355, controller 510 can cause node 350 to be grounded and node 355 to be connected to the reference voltage at node 505. Controller 510 alternatively can cause node 350 to be connected to the reference voltage at node 505 and node 355 to be grounded. As such, C(310) can be charged with the reference voltage on node 350 and node 355 grounded, or vice versa. In response to C(310) being charged, switches 515A, 525A, 545A, and 555A are opened by controller 510. Controller 510 closes switch 535A or 565A to draw current from C(310) or C(320), respectively, through controller 510, charging the charge transfer capacitor C(transfer) 580A. The amount of charge transferred from C(310) or C(320) is a function of the effective capacitance of the capacitors, which in turn is a function of the amount of surface area overlap between the corresponding fixed electrodes and moveable electrode 390 as moveable electrode 390 moves along pathway 395.

Controller 510 calculates the amount of charge transferred between C(310) and C(320) to C(transfer) 580A. In one example, the number of charge transfer cycles (e.g., using a counter to measure) needed for the voltage on C(transfer) 580A to reach a predetermined threshold voltage determines the capacitance of C(310) and C(320). In another example, a predetermined number of charge transfer cycles are performed and the resulting voltage on C(transfer) 580A is measured (e.g., via an analog-to-digital converter) and mapped to a capacitance value. Controller 510 can measure the effective capacitance for the second fixed pair of electrodes at nodes 360 and 365 in a similar manner. Any appropriate technique for determining the capacitance may be used instead of charge transfer. Each charge/discharge cycle takes a fraction of a second, such that hundreds or thousands of charge/discharge cycles may be performed each second.

The effective capacitance between node 350 and moveable electrode 390 may be represented as:

$$Ceff(\text{node } 350; \text{electrode} 390) = C(310) + \Delta C(310) + C(310)err$$

where C(310) represents the capacitance of C(310) with moveable electrode 390 at a preset location relative to fixed electrode 310; ΔC(310) represents the change in C(310) due to the movement of moveable electrode 390 along pathway 395; and C(310)err represents the change in C(310) due to tilting of moveable electrode 390 and changes in d1. C(310) err and C(320)err for the effective capacitance between node 355 and moveable electrode 390 have the same magnitude but the opposite effect on their respective capacitances. Moveable electrode 390 moving closer to C(310) corresponds to moveable electrode 390 moving farther from C(320), causing the chances in capacitance due to tilting of moveable electrode 390 to be cancelled out.

The effective capacitances between the remaining nodes 355, 360, and 365 and moveable electrode 390 can be represented in a similar manner. The position of moveable electrode 390 along pathway 395 may be determined based on the effective capacitances. However, controller 510 sequentially measures the effective capacitance between nodes 350 and 355 and the effective capacitance between nodes 360 and 365, not simultaneously. The first and second pairs of fixed electrodes can experience different environmental conditions at different measurement times, such that interfering electric fields, electrical fast transients, and the like are not cancelled out. The error introduced by electric fields, electrical fast transients, and the like can carry through calculations to determine the position of the moveable electrode 390 along pathway 395 and result in an incorrect position determination. While oversampling, threshold changes, and further processing of the measured capacitances can be used to identify erroneous measurements, the calculations can be computationally expensive and complicate operation of capacitive sensing circuit 500.

Figure 6A:
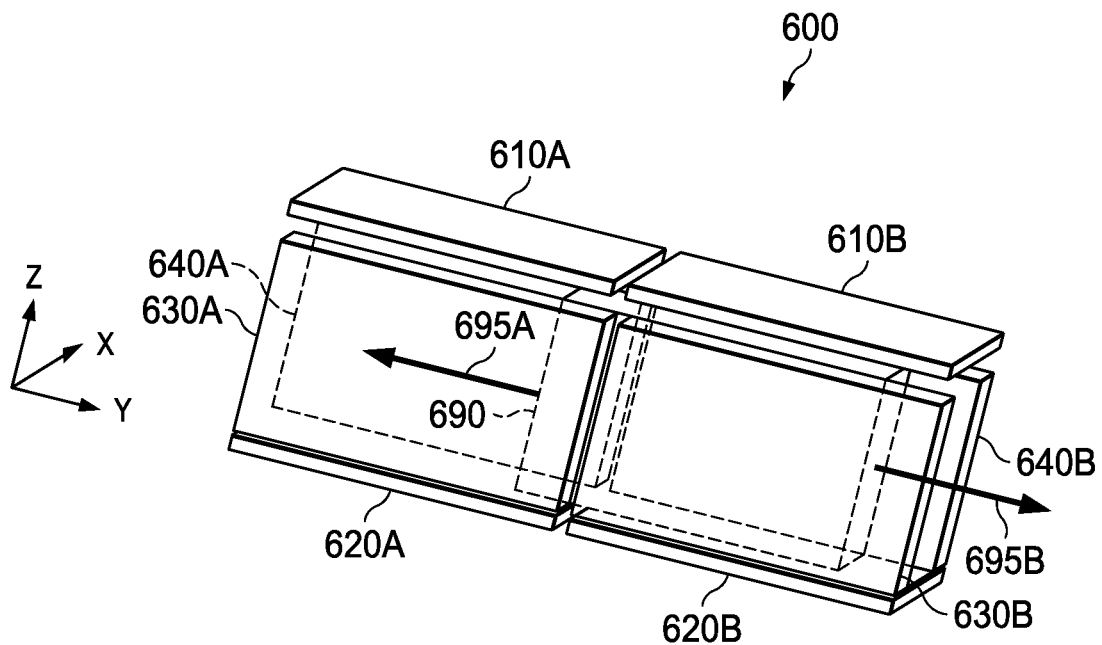
Figure 6B:
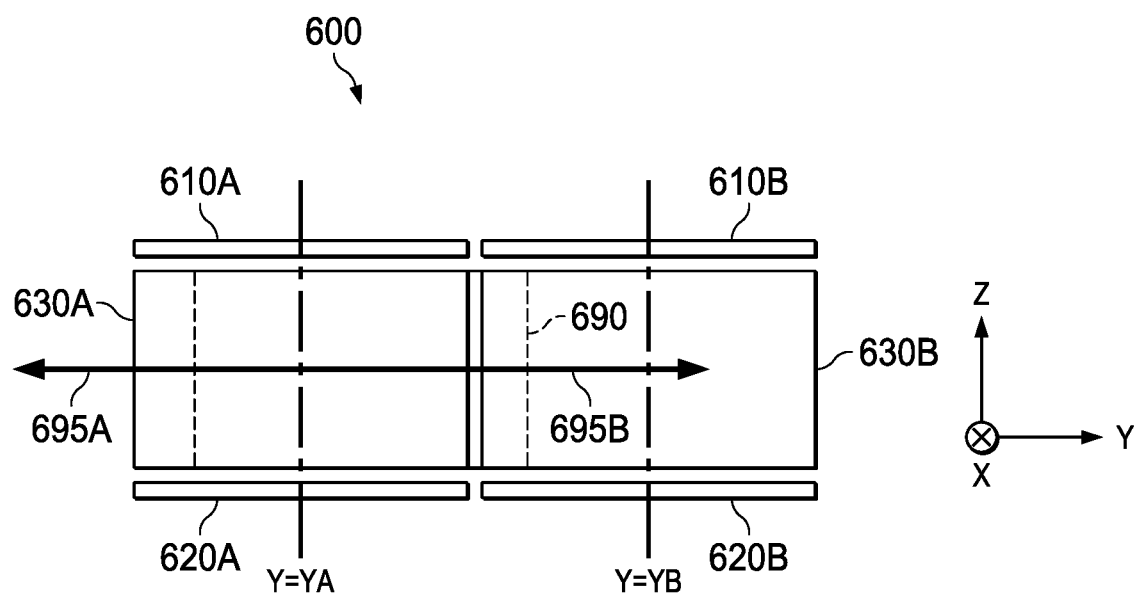

FIGS. 6A-C illustrate an example configuration 600 of a moveable electrode 690 and four pairs of fixed electrodes. Configuration 600 includes a first pair of fixed electrodes 610A and 620A, a second pair of fixed electrodes 610B and 620B adjacent to the first pair of fixed electrodes, a third pair of fixed electrodes 630A and 640A, and a fourth pair of fixed electrodes 630B and 640B adjacent to the third pair of fixed electrodes. FIG. 6A illustrates an angled perspective of configuration 600. The first pair of fixed electrodes 610A and 620A, the second pair of fixed electrodes 6106 and 620B, the third pair of fixed electrodes 630A and 640A, and the fourth pair of fixed electrodes 630B and 640B are each separated by a distance such that the fixed electrodes define an interstitial pathway, such as a tunnel. Moveable electrode 690 moves along the interstitial pathway, indicated by arrows 695A-B.

FIG. 6B illustrates a side view of configuration 600. In the first pair of fixed electrodes, electrode 610A and electrode 620A are separated by a distance such that moveable electrode 690 can pass between electrode 610A and electrode 620A. Electrode 630A occupies a portion of the distance between electrode 610A and electrode 620A. Although not shown, electrode 640A is separated from electrode 630A by a distance such that moveable electrode 690 can pass between electrode 630A and electrode 640A. In the second pair of electrodes, electrode 610B and electrode 620B are separated by a distance such that moveable electrode 690 can pass between electrode 610B and electrode 620B. Electrode 630B occupies a portion of the distance between electrode 610B and electrode 620B. Although not shown, electrode 640B is separated from electrode 630B by a distance such that moveable electrode 690 can pass between electrode 630B and electrode 640B.

The inverse change in capacitance for the first pair of fixed electrodes 610A and 620A and for the second pair of fixed electrodes 610B and 620B and the inverse change in capacitance for the third pair of fixed electrodes 630A and 640A and for the fourth pair of fixed electrodes 630B and 640B negate any changes in capacitance due to interfering electric fields and changes in temperature, humidity, air pressure, supply voltage, device parameters, and the like. As discussed previously herein with reference to configuration 300 shown in FIGS. 3A-C, movement of moveable electrode 690 along pathway 695 relative to fixed electrodes 610A-640A and 610B-640B changes the capacitance between fixed electrodes 610A-640A and 610B-640B and moveable electrode 690. The movement of moveable electrode 690 along pathway 695 and its position may be determined based on the inverse changes in capacitance for the first and second pairs of electrodes or based on the inverse changes in capacitance for the third and fourth pairs of electrodes.

FIG. 6C illustrates cross-sections of configuration 600 at y=yA and y=yB, indicated in FIG. 6B. The cross-section at y=yA shows the first pair of fixed electrodes 610A and 620A, the third pair of fixed electrodes 630A and 640A, and moveable electrode 690. Surface 615 of moveable electrode 690 is adjacent to fixed electrode 610A, and surface 625 of moveable electrode 690 is adjacent to fixed electrode 620A. Fixed electrodes 610A and 620A are coupled together at node 650. Surface 635 of moveable electrode 690 is adjacent to fixed electrode 630A, and surface 645 of moveable electrode 690 is adjacent to fixed electrode 640A. Fixed electrodes 630A and 640A are coupled together at node 660. While the effective capacitance between nodes 650 and 660 is measured by a capacitive sensing circuit, node 650 can be coupled to a supply voltage and node 660 is coupled to ground, and vice versa. In some embodiments, the third pair of fixed electrodes 630A and 640A are permanently coupled to ground and are not coupled to a capacitive sensing circuit by a switch at node 660.

The cross-section at y=yB shows the second pair of fixed electrodes 610B and 620B, the fourth pair of fixed electrodes 630B and 640B, and moveable electrode 690. Surface 615 of moveable electrode 690 is adjacent to fixed electrode 610B, and surface 625 of moveable electrode 690 is adjacent to fixed electrode 620B. Fixed electrodes 610B and 620B are coupled together at node 670. Surface 635 of moveable electrode 690 is adjacent to fixed electrode 630B, and surface 645 of moveable electrode 690 is adjacent to fixed electrode 640B. Fixed electrodes 630B and 640B are coupled together at node 680. While the effective capacitance between nodes 670 and 680 is measured by a capacitive sensing circuit, node 670 can be coupled to a supply voltage and node 680 is coupled to ground, and vice versa. In some embodiments, the fourth pair of fixed electrodes 630B and 640B are permanently coupled to ground and are not coupled to a capacitive sensing circuit by a switch at node 680.

As discussed previously herein with reference to configuration 300 and distances d1-d4 shown in FIG. 3C, the distances between surfaces 615, 625, 635, and 645 and the four pairs of fixed electrodes may vary due to manufacturing tolerances in the dimensions and shapes of the surfaces of the electrodes, tilting of moveable electrode 690 relative to the fixed electrodes 610A-640A and 610B-640B, and/or vibrations experienced by a device including electrode configuration 600. Similar to configuration 300, any changes in capacitance between a surface 615-645 and a fixed electrode 610A-640A or 610B-640B from a change in distance is offset by a corresponding and inverse change in capacitance between an opposing surface and an opposing fixed electrode.

FIG. 7 shows an electrical model 700 of the electrodes in configuration 600 shown in FIGS. 6A-C. Capacitor C(610A) represents the capacitance formed by fixed electrode 610A and surface 615, and capacitor C(620A) represents the capacitance formed by fixed electrode 620A and surface 625. Capacitor C(630A) represents the capacitance formed by fixed electrode 630A and surface 635, and capacitor C(640A) represents the capacitance formed by fixed electrode 640A and surface 645. Capacitors C(610A) and C(620A) are connected in parallel. Capacitors C(630A) and C(640A) are connected in parallel. C(610A) and C(620A) are connected in series with C(630A) and C(640A) via moveable electrode 690.

Capacitor C(610B) represents the capacitance formed by fixed electrode 610B and surface 615, and capacitor C(620B) represents the capacitance formed by fixed electrode 620B and surface 625. Capacitor C(630B) represents the capacitance formed by fixed electrode 630B and surface 635, and capacitor C(640B) represents the capacitance formed by fixed electrode 640B and surface 645. Capacitors C(610B) and C(620B) are connected in parallel. Capacitors C(630B) and C(640B) are connected in parallel. C(610B) and C(620B) are connected in series with C(630B) and C(640B) via moveable electrode 690. In this example, moveable electrode 690 floats, that is, moveable electrode 690 is not galvanically connected to a capacitance sensing circuit.

Within each pair of fixed electrodes and the corresponding parallel pairs of capacitors C(610A)/C(620A), C(630A)/C(640A), C(610B)/C(620B), and C(630B)/C(640B), the capacitance of one capacitor in the pair may vary relative to the other capacitor, as discussed previously herein with reference to FIG. 4. For example, due to tilting of moveable electrode 690 within pathway 695, the distance between moveable electrode 690 and each of fixed electrodes 610-640A and 610-640B and the corresponding capacitances may change. However, the change in one capacitor in the parallel pair corresponds to an inverse change in the other capacitor. As such, those changes in capacitance within each parallel pair are not shown in FIG. 7.

The larger, dashed arrows through C(610A)-C(640A) and C(610B)-C(640B) indicate the change in each capacitance relative to the other. For example due to movement of moveable electrode 690 along pathway 695, the surface area between moveable electrode 690 and the first fixed pair of electrodes 610A and 620A and the third fixed pair of electrodes 630A and 640A increases while the surface area between moveable electrode 690 and the second fixed pair of electrodes 610B and 620B and the fourth fixed pair of electrodes 630B and 640B decreases, and vice versa. The position and movement of moveable electrode 690 along pathway 695 can be determined from the differential capacitance measurements for the first and second pairs of fixed electrodes and/or from the differential capacitance measurements for the third and fourth pairs of fixed electrodes.

Figure 8:
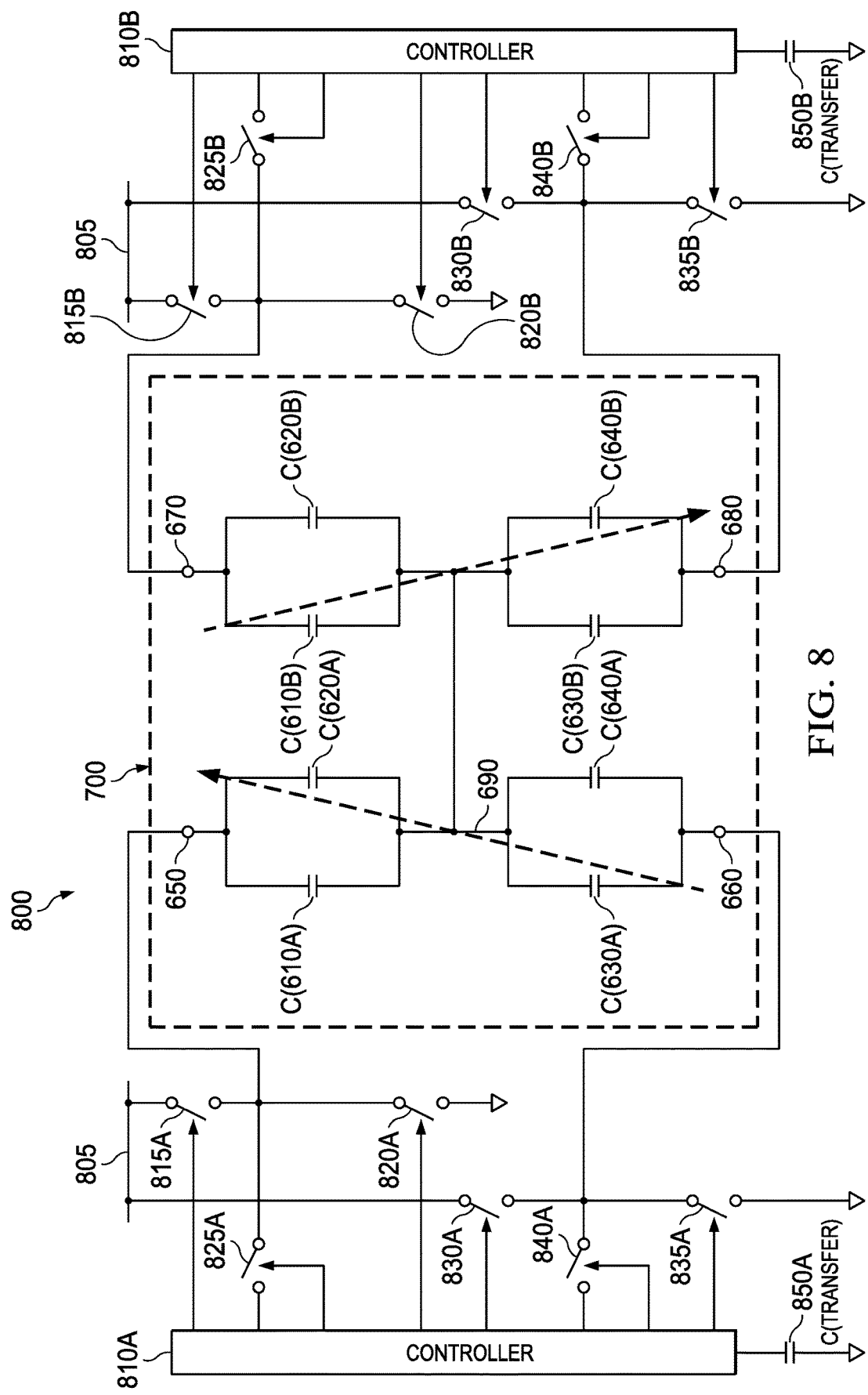
FIG. 8 shows an example differential capacitive sensing circuit coupled to the electrode configuration of FIGS. 6A-C for measuring the effective capacitance of the moveable and fixed electrodes.

FIG. 8 shows an example capacitive sensing circuit 800 coupled to the electrode configuration 600 of FIGS. 6A-C for measuring the effective capacitance of the moveable and fixed electrodes. The electrodes in configuration 600 are represented by electrical model 700 shown in FIG. 7. Capacitive sensing circuit 800 is coupled to nodes 650, 660, 670, and 680 to determine the effective capacitance at each of nodes 650, 660, 670, and 680. In this example, capacitive sensing circuit 800 includes controllers 810A-B, switches 815A-B, 820A-B, 825A-B, 830A-B, 835A-B, and 840A-B, and charge transfer capacitors C(transfer) 850A-B. Capacitive sensing circuit 800 implements a charge transfer technique to determine the effective capacitance of the first pair of capacitors C(610A) and C(620A), the second pair of capacitors C(610B) and C(620B), the third pair of capacitors C(630A) and C(640A), and the fourth pair of capacitors C(630B) and C(640B). Any appropriate technique for determining the capacitance may be used instead of charge transfer.

Controllers 810A-B operate in a similar manner to controller 510 shown in FIG. 5. Although controllers 810A-B are shown as two distinct controllers in this example, in other embodiments the functions performed by controllers 810A-B may be performed by one controller alone or by more than two controllers working in tandem. Node 650 is connected to switches 815A, 820A, and 825A. Node 660 is connected to switches 830A, 835A, and 840A. Node 670 is connected to switches 815B, 820B, and 825B. Node 680 is connected to switches 830B, 835B, and 840B.

The effective capacitance between node 650 and moveable electrode 690 may be represented as:

$$C\mathit{eff}(650;690)=C(610A)n+C(620A)n$$

where:

$$C(610A)n=C(610A)+\Delta C(610A)+C(610A)\mathit{err}$$

and:

$$C(620A)n=C(620A)+\Delta C(620A)-C(620A)\mathit{err}$$

where C(610A) represents the capacitance of C(610A) with moveable electrode 690 at a preset location relative to fixed electrode 610A; ΔC(610A) represents the change in C(610A) due to the movement of moveable electrode 690 along pathway 695; C(610A)err represents the change in C(610A) due to tilting of moveable electrode 690; C(620A) represents the capacitance of C(620A) with moveable electrode 690 at the preset location relative to fixed electrode 620A; ΔC(620A) represents the change in C(620A) due to the movement of moveable electrode 690 along pathway 695; and C(620A)err represents the change in C(620A) due to tilting of moveable electrode 690. For C(610A)n, the error C(610A)err is added while for C(620A)n, the error C(620A)err is subtracted because tilting of moveable electrode 690 affects fixed electrode 610A and fixed electrode 620A inversely. The effective capacitance between node 670 and moveable electrode 690, between node 660 and moveable electrode 690, and between node 680 and moveable electrode 690 may be represented similarly.

The position of moveable electrode 690 along pathway 695 may be determined based on the serial capacitance of Ceff (650; 690) and Ceff (660; 690) and the serial capacitance of Ceff (670; 690) and Ceff (680; 690). The serial capacitance of Ceff (650; 690) and Ceff (660; 690) may be represented as:

$$C\mathit{serial}(650;660) = \frac{C\mathit{eff}(650;690)*C\mathit{eff}(660;690)}{C\mathit{eff}(650;690)+C\mathit{eff}(660;690)}.$$

The serial capacitance of Ceff(670; 690) and Ceff(680; 690) may be represented similarly. The capacitances of Cserial (650; 660) and Cserial(670; 680) are used to determine the position of moveable electrode 690 along pathway 695. This position determination technique is described further herein with reference to FIG. 9A.

Alternatively, the position of moveable electrode 690 along pathway 695 may be determined based on the serial capacitance of Ceff (650; 690) and Ceff (660; 690) in parallel with Ceff (670; 690) in parallel with Ceff (680; 690), which may be presented as:

$$Cserial(650;\ 660\|670\|680) = \frac{Ceff(650;\ 690) * \begin{bmatrix} Ceff(660;\ 690) + \\ Ceff(670;\ 690) + Ceff(680;\ 690) \end{bmatrix}}{Ceff(650;\ 690) + \begin{bmatrix} Ceff(660;\ 690) + \\ Ceff(670;\ 690) + Ceff(680;\ 690) \end{bmatrix}}$$

The differential capacitance to Cserial(650; 660∥670∥680) is Cserial(670; 650∥660∥680), which may be represented similarly. The capacitances of Cserial(650; 660∥670∥680) and Cserial(670; 650∥660∥680) are used to determine the position of moveable electrode 690 along pathway 695. The capacitances of Cserial(660; 650∥670∥680) and Cserial(680; 650∥660∥670) can be used to determine the position of moveable electrode 690 as well. This position determination technique is described further herein with reference to FIG. 9B.

Because the fixed electrodes in each pair of fixed electrodes can be coupled together in parallel, changes in capacitance due to tilting of moveable electrode 690 are cancelled out. Similarly, the capacitances at nodes 650 and 670 can be determined simultaneously, such that the fixed electrodes 610A, 620A, 610B, and 620B experience substantially the same environmental conditions such as interfering electric fields and changes in temperature, humidity, air pressure, supply voltage, device parameters, and the like. Any changes in capacitance due to changes in environmental conditions are substantially cancelled out, and the remaining changes in the capacitance at node 650 relative to the capacitance at node 670 are substantially caused by the movement of moveable electrode 690 along pathway 695, such that the position of moveable electrode 690 may be determined based on the inverse changes in capacitance.

Figure 9A:
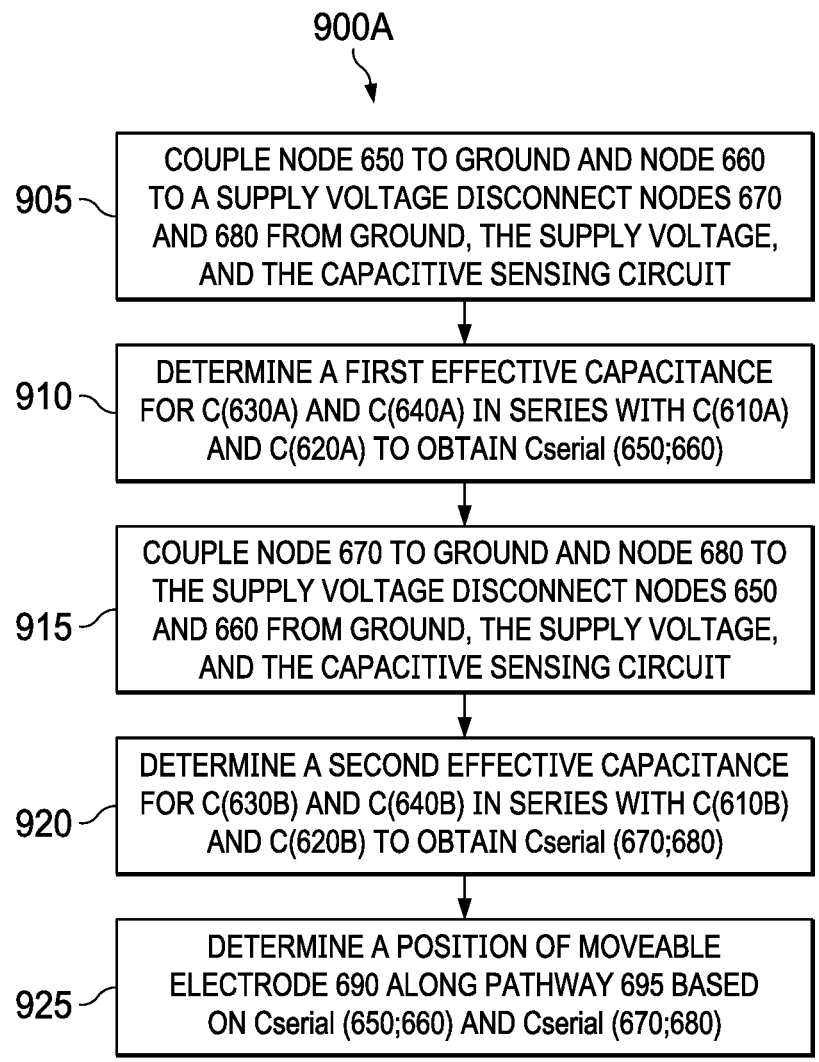
FIGS. 9A-B illustrate, in flow chart form, example processes for determining a position of a moveable electrode using a differential capacitive sensing circuit.
Figure 9B:
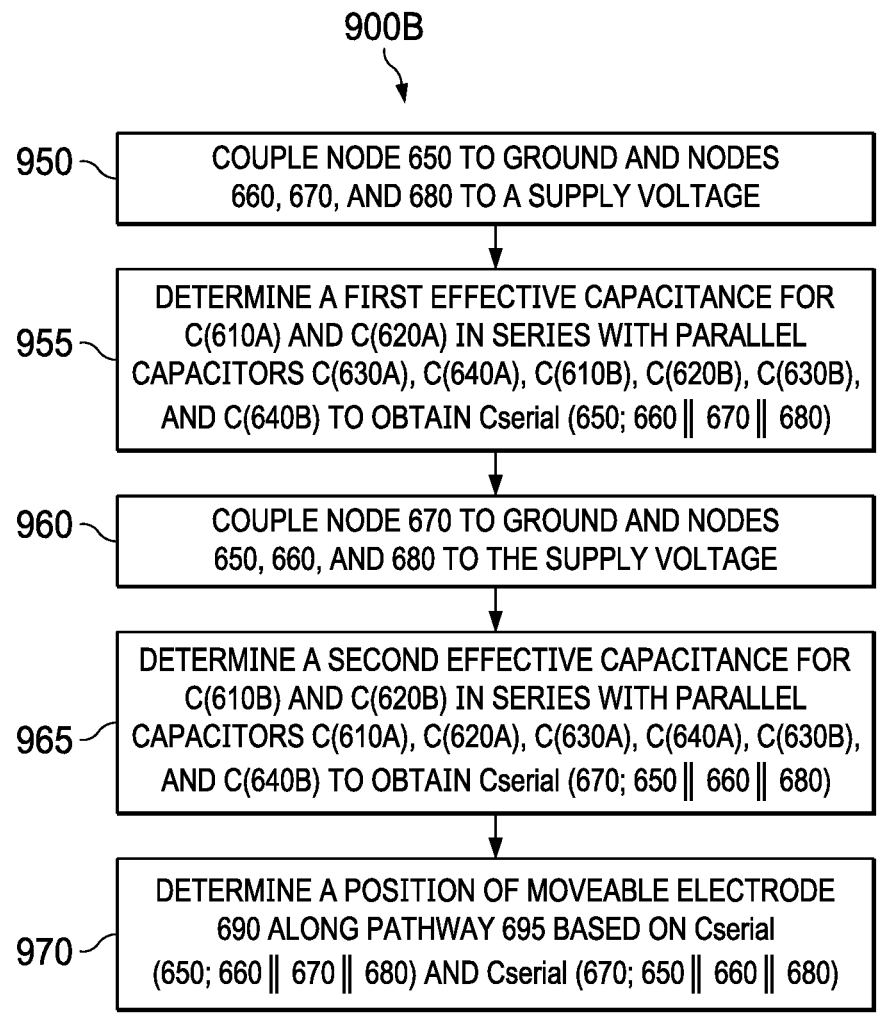

FIGS. 9A-B illustrate, in flow chart form, example processes 900A and 900B for determining a position of a moveable electrode using a capacitance sensing system. For ease of explanation, processes 900A and 900B are described herein with reference to capacitance sensing system 800 shown in FIG. 8. In FIG. 9A, process 900A includes step 905, at which controller 810A couples node 650 to ground and node 660 to the reference voltage node 805. Alternatively, controller 810A couples node 660 to ground and node 650 to the reference voltage node 805. Controller 810B disconnects nodes 670 and 680 from ground, the reference voltage node 805, and the rest of capacitive sensing circuit 800. At step 910, controller 810A determines a first effective capacitance for the third pair of capacitors C(630A) and C(640A) in series with the first pair of capacitors C(610A) and C(620A) to obtain Cserial(650; 660).

At step 915, controller 810B couples node 670 to ground and node 680 to the reference voltage node 805. Alternatively, controller 810B couples node 680 to ground and node 670 to the reference voltage node 805. Controller 810A disconnects nodes 650 and 660 from ground, the reference voltage node 805, and the rest of capacitive sensing circuit 800. At step 920, controller 810B determines a second effective capacitance for the fourth pair of capacitors C(630B) and C(640B) in series with the second pair of capacitors C(610B) and C(620B) to obtain Cserial(670; 680). At step 925, controllers 810A-B determine a position of moveable electrode 690 along pathway 695 based on Cserial(650; 660) and Cserial(670; 680). The position of moveable electrode 690 can be provided to other circuits, which may be configured to modify their operation based on the position of moveable electrode 690.

In FIG. 9B, process 900B includes step 950, at which controllers 810A-B couple node 650 to ground and nodes 660, 670, and 680 to the reference voltage node 805. Alternatively, controllers 810A-B couple node 650 to the reference voltage node 805 and nodes 660, 670, and 680 to ground. At step 955, controllers 810A-810B determine a first effective capacitance for C(610A) and C(620A) in series with parallel capacitors C(630A) and C(640A), C(610B) and C(620B), and C(630B) and C(640B) to obtain Cserial(650; 660∥670∥680). At step 960, controllers 810A-B couple node 670 to ground and nodes 650, 660, and 680 to the reference voltage node 805. Alternatively, controllers 810A-B couple node 670 to the reference voltage node 805 and nodes 650, 660, and 680 to ground.

At step 965, controllers 810A-810B determine a second effective capacitance for C(610B) and C(620B) in series with parallel capacitors C(610A) and C(620A), C(630A) and C(640A), and C(630B) and C(640B) to obtain Cserial(670; 650∥660∥680). At step 970, controllers 810A-B determine a position of moveable electrode 690 along pathway 695 based on Cserial(650; 660∥670∥680) and Cserial(670; 650∥660∥680). The position of moveable electrode 690 can be provided to other circuits, which modify their operation based on the position of moveable electrode 690.

Figure 10A:
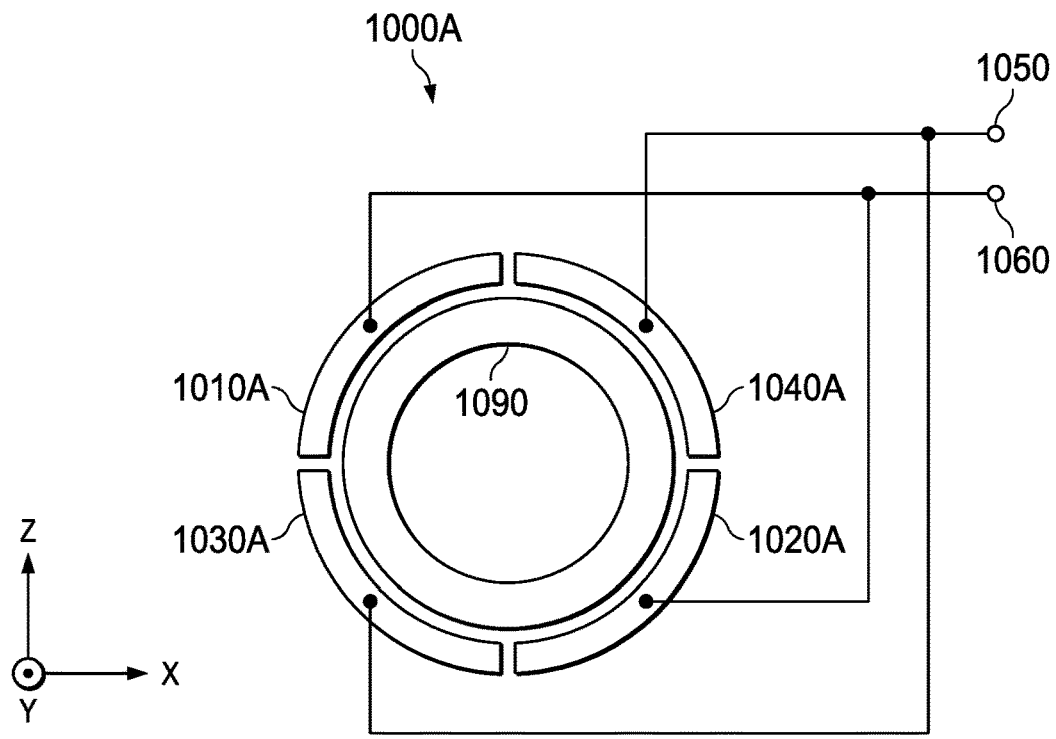
FIGS. 10A-F show further example configurations of moveable and fixed electrodes.
Figure 10B:
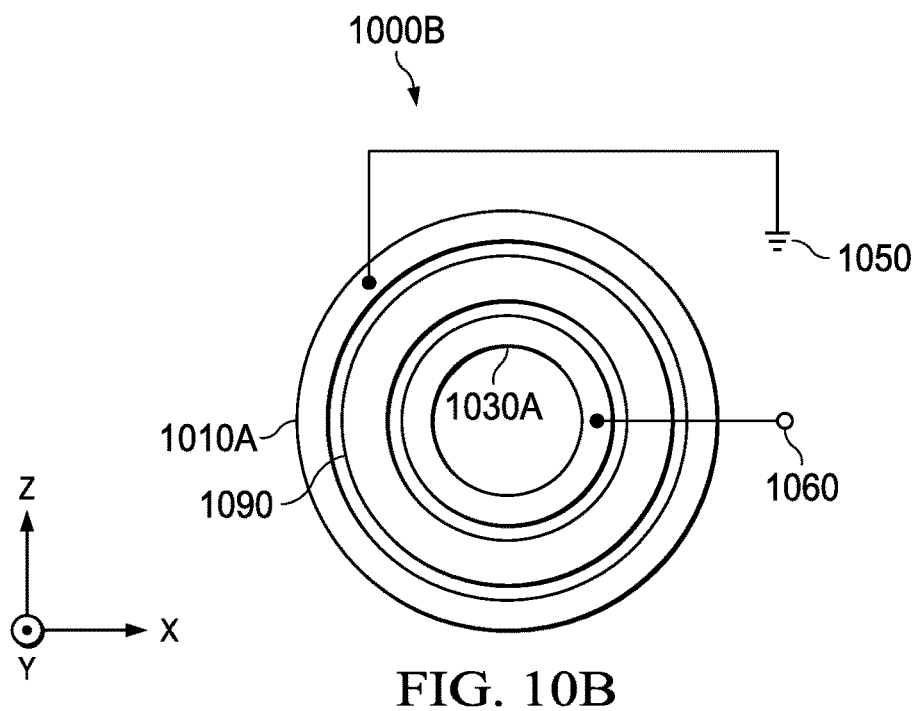
Figure 10C:
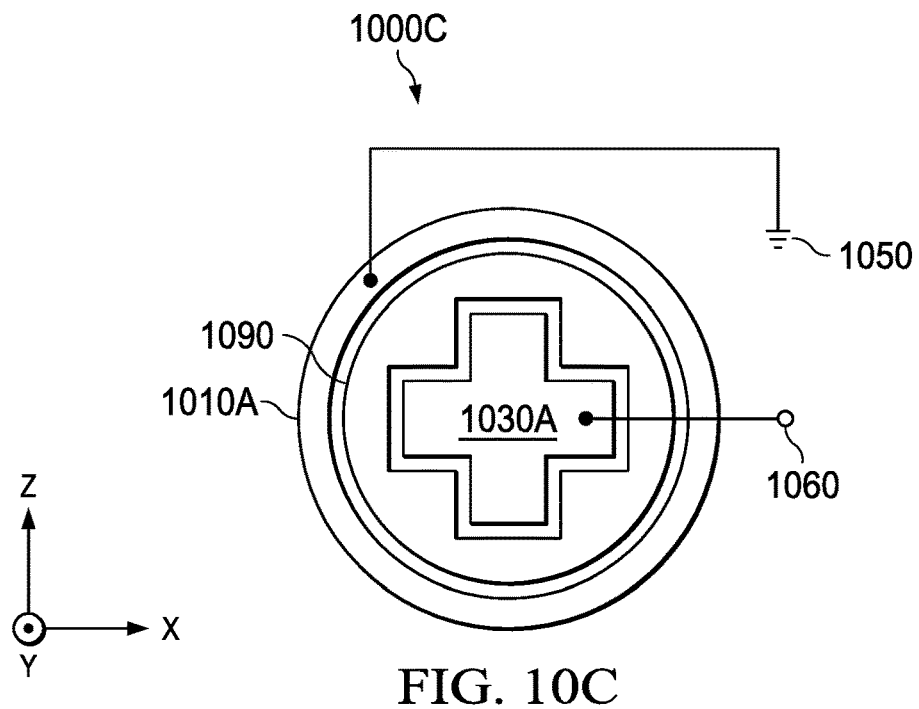
Figure 10D:
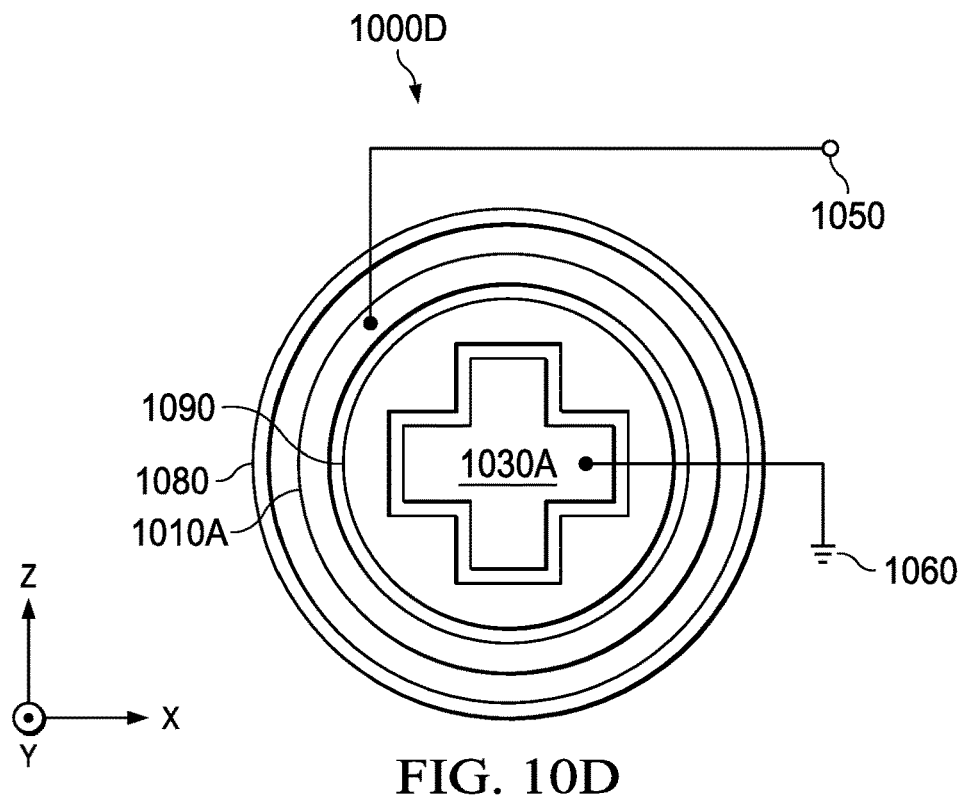
Figure 10E:
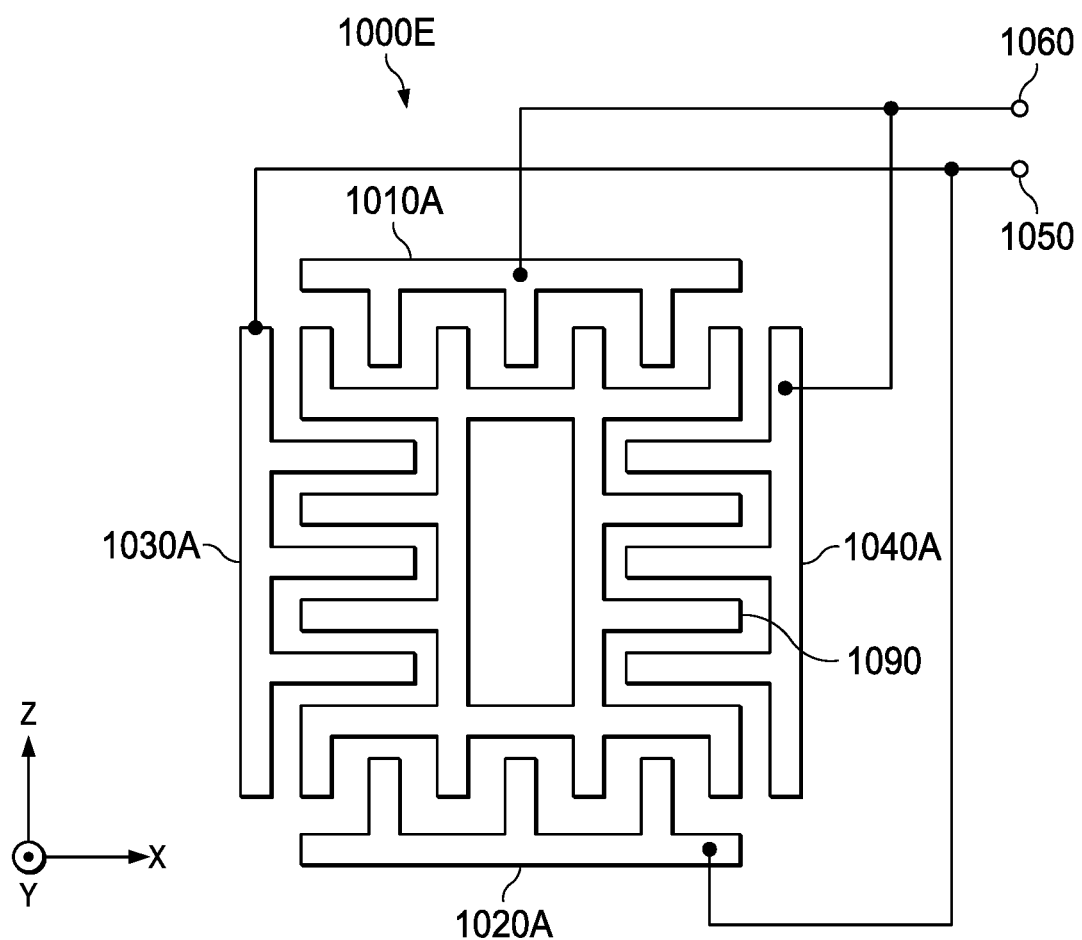
Figure 10F:
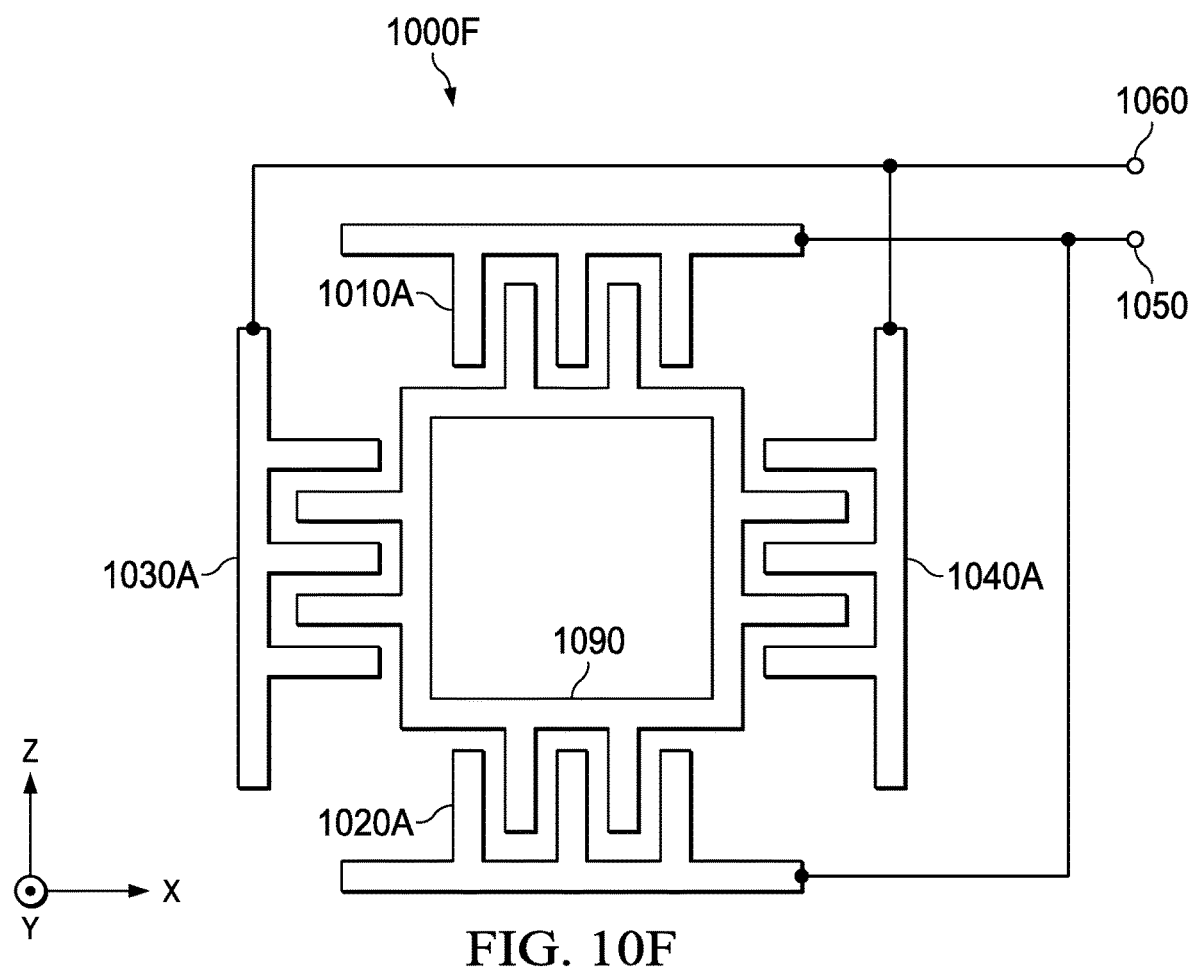

FIGS. 10A-F show cross-sections of further example configurations of moveable and fixed electrodes. In each of FIGS. 10A-F, only one cross-section (e.g., a cross-section of the "A" electrodes) of the example configuration is shown, but the example configuration includes a corresponding second set of electrodes (e.g., a set of "B" electrodes). Although FIGS. 3A-C and 6A-C show rectangular or square shaped electrodes, an even number of electrodes with any kind of symmetrical shape may be used. FIGS. 10A-B illustrate circular shaped fixed and moveable electrodes. In FIG. 10B, moveable electrode 1090 is shaped as a hollow cylinder and fixed electrode 1030A is fixed in the interior of pathway 1095 for moveable electrode 1090. In FIGS. 10C-D, fixed electrode 1030A is fixed in the interior of pathway 1095 and cross shaped. Although fixed electrodes 1010A and 1030A are not the same shape, the change in capacitance due to movement of moveable electrode 1090 has a known relationship based on the surface area of each of fixed electrodes 1010A and 1030A, such that the position of moveable electrode 1090 may still be determined. In both FIGS. 10B and 10C, the outer electrode 1010A is connected to ground, which shields the system from electromagnetic interference and reduces the complexity of the electromechanical setup, precluding the use of an active shield such as the one shown in FIG. 10D. In FIG. 10D, fixed electrode 1010A is surrounded by an active electrical shield 1080. In FIGS. 10E-F, fixed electrodes 1010A-1040A and moveable electrode 1090 have interleaving plates to increase the surface area between the fixed electrodes and moveable electrode 1090, which increases capacitance and the sensitivity of electrode configurations 1000E and 1000F compared to electrode configurations 300 and 600, shown in FIGS. 3A-C and 6A-C, respectively.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

What is claimed is:

1. An apparatus, comprising:
   a first set of electrodes;
   a second set of electrodes, wherein the first and second sets of electrodes define and form a pathway;
   a first electrode disposed in the pathway formed by the first and second sets of electrodes and configured to move along the pathway; and
   a capacitance sensing circuit coupled to the first and second sets of electrodes and configured to:
      determine a capacitance of a first capacitor based on a first amount of the first electrode between the first set of electrodes;
      determine a capacitance of a second capacitor based on a second amount of the first electrode between the first set of electrodes, wherein the first capacitor is coupled in parallel with the second capacitor;
      determine a capacitance of a third capacitor based on a third amount of the first electrode between the second set of electrodes; and
      determine a capacitance of a fourth capacitor based on a fourth amount of the first electrode between the second set of electrodes, wherein the third capacitor is coupled in parallel with the fourth capacitor, wherein the third capacitor and the fourth capacitor are electrically coupled to the first capacitor and second capacitor.

2. The apparatus of claim 1, wherein:
   the first set of electrodes comprises a first pair of electrodes and a second pair of electrodes;
   the first pair of electrodes are coupled together at a first node;
   the second pair of electrodes are coupled together at a second node;
   the second set of electrodes comprises a third pair of electrodes and a fourth pair of electrodes;
   the third pair of electrodes are coupled together at a third node; and
   the fourth pair of electrodes are coupled together at a fourth node.

3. The apparatus of claim 2, wherein:
   the first node is configured to be coupled to one of a fixed reference voltage, a ground node, and the capacitance sensing circuit;
   the second node is configured to be coupled to one of the fixed reference voltage, the ground node, and the capacitance sensing circuit;
   the third node is configured to be coupled to one of the fixed reference voltage, the ground node, and the capacitance sensing circuit; and
   the fourth node is configured to be coupled to one of the fixed reference voltage, the ground node, and the capacitance sensing circuit.

4. The apparatus of claim 3, wherein the capacitance sensing circuit is further configured to:
   cause the second and fourth nodes to be coupled to the ground node;
   cause a voltage to be provided to the first and third nodes;
   cause charge to be transferred from the first node to the first capacitor; and
   cause charge to be transferred from the third node to the second capacitor.

5. The apparatus of claim 3, wherein the capacitance sensing circuit is further configured to:
   cause the second and fourth nodes to be uncoupled from the fixed reference voltage, the ground node, and the capacitance sensing circuit;
   cause a voltage to be provided to the first node;
   cause the third node to be coupled to the ground node;
   cause charge to be transferred from the first node to a charge transfer capacitor;
   cause a voltage to be provided to the third node;
   cause the first node to be coupled to the ground node; and
   cause charge to be transferred from the third node to the charge transfer capacitor.

6. The apparatus of claim 3, wherein the capacitance sensing circuit is further configured to:
   cause the first and third nodes to be uncoupled from the fixed reference voltage, the ground node, and the capacitance sensing circuit;
   cause a voltage to be provided to the second node;
   cause the fourth node to be coupled to the ground node;
   cause charge to be transferred from the second node to a charge transfer capacitor;
   cause a voltage to be provided to the fourth node;
   cause the second node to be coupled to the ground node; and
   cause charge to be transferred from the fourth node to the charge transfer capacitor.

7. The apparatus of claim 3, wherein the capacitance sensing circuit is further configured to:
   cause a voltage to be provided to the first node;
   cause the second, third, and fourth nodes to be coupled to the ground node;
   cause charge to be transferred from the first node to a charge transfer capacitor;
   cause a voltage to be provided to the third node;
   cause the first, second, and fourth nodes to be coupled to the ground node; and
   cause charge to be transferred from the third node to the charge transfer capacitor.

8. The apparatus of claim 3, wherein the capacitance sensing circuit is further configured to:
   cause a voltage to be provided to the second, third, and fourth nodes;
   cause the first node to be coupled to the ground node;
   cause charge to be transferred from the second, third, and fourth nodes to a charge transfer capacitor;
   cause a voltage to be provided to the first, second, and fourth nodes;
   cause the third node to be coupled to the ground node; and
   cause charge to be transferred from the first, second, and fourth nodes to the charge transfer capacitor.

9. The apparatus of claim 3, wherein the capacitance sensing circuit is further configured to:
   cause a voltage to be provided to the second node;
   cause the first, third, and fourth nodes to be coupled to the ground node;
   cause charge to be transferred from the second node to a charge transfer capacitor;
   cause a voltage to be provided to the fourth node;
   cause the first, second, and third nodes to be coupled to the ground node; and
   cause charge to be transferred from the fourth node to the charge transfer capacitor.

10. The apparatus of claim 3, wherein the capacitance sensing circuit is further configured to:
   cause a voltage to be provided to the first, third, and fourth nodes;

cause the second node to be coupled to the ground node;
cause charge to be transferred from the first, third, and fourth nodes to a charge transfer capacitor;
cause a voltage to be provided to the first, second, and third nodes;
cause the fourth node to be coupled to the ground node; and
cause charge to be transferred from the first, second, and third nodes to the charge transfer capacitor.

11. The apparatus of claim 1, wherein the first electrode comprises a floating electrode.

12. The apparatus of claim 1, wherein the first electrode is not electrically connected to the capacitance sensing circuit.

13. An apparatus, comprising:
a first pair of electrodes, comprising a first electrode and a second electrode separated from the first electrode by a first distance;
a second pair of electrodes adjacent to the first pair of electrodes, comprising a third electrode adjacent to the first electrode and a fourth electrode adjacent to the second electrode and separated from the third electrode by a second distance, wherein the first and second pairs of electrodes define a pathway between the first and second electrodes and the third and fourth electrodes;
a fifth electrode disposed in the pathway formed by the first and second pairs of electrodes and configured to move along the pathway; and
a capacitance sensing circuit coupled to the first and second pairs of electrodes and configured to:
determine a first capacitance of a first capacitor and a second capacitance of a second capacitor based on a first overlap of surface areas between the fifth electrode and the first pair of electrodes, wherein the first capacitor and the second capacitor are coupled together in series; and
determine a third capacitance of a third capacitor and a fourth capacitance of a fourth capacitor using a second overlap of surface areas between the fifth electrode and the second pair of electrodes, wherein the third capacitor and the fourth capacitor are coupled together in series, wherein the third capacitor and the fourth capacitor are electrically coupled to the first capacitor and second capacitor.

14. The apparatus of claim 13, wherein the fifth electrode comprises:
a first opposing surface adjacent to the first and third electrodes; and
a second opposing surface adjacent to the second and fourth electrodes.

15. The apparatus of claim 14, wherein the capacitance sensing circuit is configured to determine the first capacitance through transfer of charge from a capacitance between the first electrode and the first opposing surface.

16. The apparatus of claim 14, wherein the capacitance sensing circuit is configured to determine the third capacitance through transfer of charge from a capacitance between the third electrode and the first opposing surface.

17. The apparatus of claim 14, further comprising:
a third pair of electrodes orthogonal to the first pair of electrodes, comprising a sixth fixed electrode and a seventh fixed electrode separated from the sixth fixed electrode by a third distance; and
a fourth pair of electrodes orthogonal to the second pair of electrodes and adjacent to the third pair of electrodes, comprising an eighth electrode and a ninth electrode separated from the eighth electrode by a fourth distance,
wherein the capacitance sensing circuit is further coupled to the third and fourth pairs of electrodes and further configured to determine capacitances of a fifth capacitor and a sixth capacitor using the third pair of electrodes and the capacitances of a seventh capacitor and an eighth capacitor using the fourth pair of electrodes.

18. The apparatus of claim 17, wherein the third and fourth pairs of electrodes are coupled to a fixed reference voltage.

19. The apparatus of claim 18, wherein the capacitance sensing circuit is configured to determine the first capacitance through transfer of charge from a capacitance between the first pair of electrodes, the fifth electrode, and the third pair of electrodes.

20. The apparatus of claim 18, wherein the capacitance sensing circuit is configured to determine the third capacitance through transfer of charge from a capacitance between the second pair of electrodes, the fifth electrode, and the fourth pair of electrodes.

21. The apparatus of claim 13, further comprising a motor, wherein a speed of the motor is controllable based on movement of the fifth electrode along the pathway.

22. The apparatus of claim 13, wherein the first and third electrodes are coupled to ground, and wherein the second and fourth electrodes and the fifth electrode are arranged within the first and third electrodes.

23. The apparatus of claim 13, further comprising an active electrical shield arranged around the first and third electrodes, wherein the active electrical shield is configured to have the same electric potential as the first and third electrodes.

24. A method, comprising:
determining a capacitance of a first capacitor and a capacitance of a second capacitor based on a first amount of a first electrode between a first pair of electrodes, wherein the first capacitor and the second capacitor are coupled together in parallel;
determining a capacitance of a third capacitor and a capacitance of a fourth capacitor based on a second amount of the first electrode between a second pair of electrodes orthogonal to the first pair of electrodes, wherein the third capacitor and the fourth capacitor are coupled together in parallel, and the first capacitor and second capacitor are coupled to the third and fourth capacitor in series;
determining a capacitance of a fifth capacitor and a capacitance of a sixth capacitor based on a third amount of the first electrode between a third pair of electrodes, wherein the third pair of electrodes is adjacent to the first pair of electrodes, wherein the fifth capacitor and the sixth capacitor are coupled together in parallel;
determining a capacitance of seventh capacitor and a capacitance of an eighth capacitor based on a fourth amount of the first electrode between a fourth pair of electrodes, wherein the fourth pair of electrodes is orthogonal to the third pair of electrodes and adjacent to the second pair of electrodes, wherein the seventh capacitor and the eighth capacitor are coupled together in parallel, wherein the fifth capacitor and the sixth capacitor are coupled to the seventh capacitor and the eighth capacitor in series, wherein the first pair, the second pair, the third pair, and the fourth pair of electrodes define an pathway; and determining a position of the first electrode along the pathway based on the capacitances of the first, second, third, fourth, fifth, sixth, seventh, and eighth capacitors, wherein each capacitor of the first, second, third, fourth, fifth, sixth, seventh, and eighth capacitors is coupled to each other capacitor of the first, second, third, fourth, fifth, sixth, seventh, and eighth capacitors.

25. The method of claim 24, further comprising:
providing the position of the first electrode along the pathway to one or more other circuits, wherein the one or more other circuits are configured to modify operation based on the position of the first electrode along the pathway.

* * * * *